(12) United States Patent
Kirn

(10) Patent No.: US 7,142,049 B2
(45) Date of Patent: Nov. 28, 2006

(54) MULTI-REFERENCE SWITCHING AMPLIFIER MODULATION METHOD AND APPARATUS

(75) Inventor: Larry Kirn, East Lansing, MI (US)

(73) Assignee: JAM Technologies, Inc., Boston, MA (US)

( * ) Notice: Subject to any disclaimer, the term of this patent is extended or adjusted under 35 U.S.C. 154(b) by 92 days.

(21) Appl. No.: 10/916,131

(22) Filed: Aug. 11, 2004

(65) Prior Publication Data

US 2005/0116770 A1 Jun. 2, 2005

Related U.S. Application Data

(60) Provisional application No. 60/494,163, filed on Aug. 11, 2003.

(51) Int. Cl.
*H03F 3/38* (2006.01)
*H03F 3/217* (2006.01)

(52) U.S. Cl. ........................................ 330/10; 330/251

(58) Field of Classification Search ............ 330/207 A, 330/251

See application file for complete search history.

(56) References Cited

U.S. PATENT DOCUMENTS 6,856,194 B1 * 2/2005 Nilsson et al. ................. 330/10
2003/0210009 A1 * 11/2003 Minciunescu ............... 318/599

* cited by examiner

*Primary Examiner*—Steven J. Mottola
(74) *Attorney, Agent, or Firm*—Gifford, Krass, Groh, Sprinkle, Anderson & Citkowski, PC

(57) ABSTRACT

Centering pulses within the output sample period corrects for instantaneous phase errors in multi-reference switching amplifiers. In the preferred embodiment, the pulses are ordered by the relative magnitude of each switched reference.

2 Claims, 3 Drawing Sheets

MULTI-REFERENCE SWITCHING AMPLIFIER MODULATION METHOD AND APPARATUS

REFERENCE TO RELATED APPLICATION

This application claims priority from U.S. Provisional Patent Application Ser. No. 60/494,163, filed Aug. 11, 2003, the entire content of which is incorporated herein by reference.

FIELD OF THE INVENTION

This invention relates generally to multi-reference switching amplifiers and, in particular, to a modulation method and apparatus for correcting instantaneous phase errors in multi-reference switching amplifiers.

BACKGROUND OF THE INVENTION

Multi-Reference Switching Amplifiers, of the type shown in U.S. Pat. No. 6,535,058 and PCT/US99/26691, the content of these being incorporated herein by reference, yield significantly higher instantaneous resolution than standard switching amplifiers, through the summation of multiple modulated outputs. In that they operate with pulsewidth modulated (PWM) signals, however, multi-reference amplifiers (like all Class D amplifiers) are subject to distortion unless phase correction is applied.

Switching amplifiers usually rely upon modulation of pulsewidths controlling switching devices which gate power to the load. Resultant output power then approximates the integral of the gated voltage or current over the output sampling period. As these pulsewidths change with dynamic data, however, pulsewidth position within the output sample period becomes significant. Considerable distortion is induced unless the relative phase of each output pulse remains constant. Centering output pulses in the output sample period typically ensures instantaneous phase coherency. It is for this reason that many analog switching amplifiers use triangle, as opposed to sawtooth, reference waveforms.

Multi-reference amplifiers, which sum and/or time-multiplex several switched references, require coherent relative phase of all switched reference pulsewidths to ensure low distortion. Additionally, pulsewidths unrelated to modulation values are typically added to each of these switched reference pulsewidths, as illustrated in my U.S. Pat. No. 6,492,868 "Dynamic Range Enhancement Technique," the entire content of which is also incorporated herein by reference. To ensure coherent relative phase of this plurality of pulsewidths can be a difficult task. A need therefore exists for an effective method of correcting instantaneous phase errors in multi-reference switching amplifiers.

SUMMARY OF THE INVENTION

The present invention resides in a method of centering within the output sample period all output pulses of a multi-reference switching amplifier. In the preferred embodiment, the pulses are ordered by the relative magnitude of each switched reference.

DETAILED DESCRIPTION OF THE INVENTION

Figure 1:
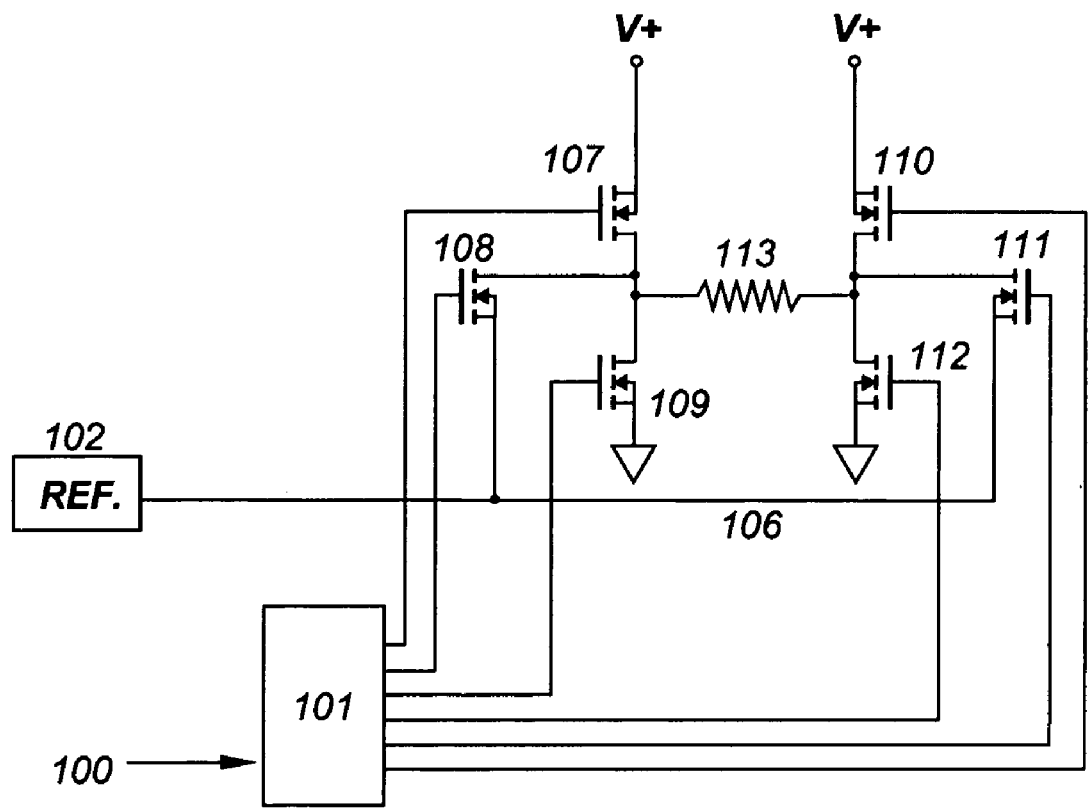
FIG. 1 shows a block diagram of a typical multi-reference amplifier using two references.

Referring now to FIG. 1, incoming data stream 100 is applied to modulator 101, which provides switching control signals to switching devices 107, 108, 109, 110, 111, and 112, the outputs of which are in turn coupled to load 113. Note that switching devices 107 and 110 selectively connect the load 113 to the V+ reference voltage, and that switching devices 108 and 111 selectively connect the load 113 to a lower reference voltage 106 from reference source 102. Switching devices 109 through 112 selectively connect the load 113 to ground. Details of such a representative multi-reference amplifier can be found in the applications referenced above.

Figure 2:
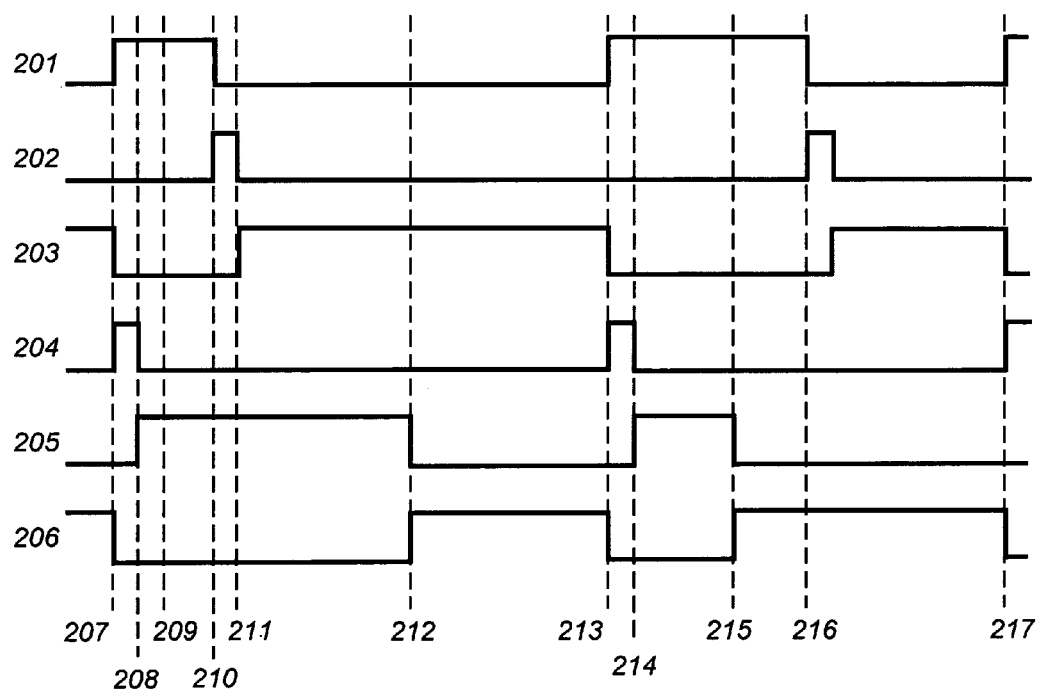
FIG. 2 shows the control waveforms of the amplifier of FIG. 1 when operated conventionally with minimum pulsewidths added to each reference, prior to the present invention.

Referring now to FIG. 2, voltage traces 201, 202, 203, 204, 205, and 206 represent control pulses from modulator 101 to switching devices 107, 108, 109, 110, 111, and 112 respectively, all of FIG. 1. The time span between markers 207 and 213 represents one output sample period of the amplifier of FIG. 1; a second sample period is shown between markers 213 and 217. At time marker 207, control voltages traces 201 and 204 indicate activation of V+ switching devices 107 and 110, respectively.

Activation time of both V+ switching devices from time marker 207 until marker 208 represents the minimum pulsewidth applied thereto, hence one switching device (110, as seen in trace 204) is deactivated at marker 208. Pulsewidth continuation of switching device 107, as seen in trace 201, until time marker 209 represents the actual coarse modulation pulsewidth. At deactivation of switching device 110 indicated in trace 204 at marker 208, the minimum pulsewidth activation of low-voltage reference switching device 111 is seen in trace 205. The minimum pulsewidth activation continues until marker 209, which denotes the start of the fine resolution modulation period.

At marker 210, the deactivation of switching device 107 is seen in trace 201, marking the end of the coarse modulation period. Concurrently at marker 210, low-voltage reference switching device 108 is seen to be activated in trace 202 for its minimum pulsewidth, until marker 211. Ground switching device 109 is indicated in trace 203 from marker 211 until the end of the sample period at marker 213. Deactivation of low-voltage switching device 111 at marker 212, seen in trace 205, denotes the end of the fine modulation period. Ground switching device 112 activation, indicated in trace 206, ensues from marker 212 to the end of the sample period at marker 213.

The FIG. 2 sequence above shows assertion of coarse and fine modulated pulsewidths of V+ and low-voltage reference switching devices, respectively, on opposing sides of load 113, of FIG. 1. This sequence as well shows assertion of minimum pulsewidths in both V+ switching devices and both low-voltage reference switching devices as well, which, being common-mode, effect no difference signal across load 113 of FIG. 1. Ground switching device activation can be seen to be the default state.

At marker 213, switching device 107 can be seen in trace 201 to be again activated for a minimum pulsewidth plus coarse modulation time, until marker 216. This activation period from marker 213 to marker 216 can be seen to be much longer than the previous activation period from marker 207 to marker 210, which indicates increasing coarse modulation voltage. Note, however, that the resultant time from the center of the V+ switching device activation between markers 207 and 210 to the center of the activation between markers 213 and 216 is substantially longer than the output sample period between markers 207 and 213. This represents a lagging phase error in the coarse resolution voltage.

At marker 214, trace 205 indicates activation of low-voltage switching device 111 for a minimum pulsewidth plus fine modulation time, until deactivation at marker 215. This activation period from marker 214 to marker 215 can be seen to be much shorter than the previous activation period from marker 208 to marker 212, which indicates decreasing fine modulation voltage. Note, however, that the resultant time from the center of the low-voltage reference switching device activation between markers 208 and 212 to the center of the activation between markers 214 and 215 is substantially shorter than the output sample period between markers 207 and 213. This represents a leading phase error in the fine resolution voltage.

Figure 3:
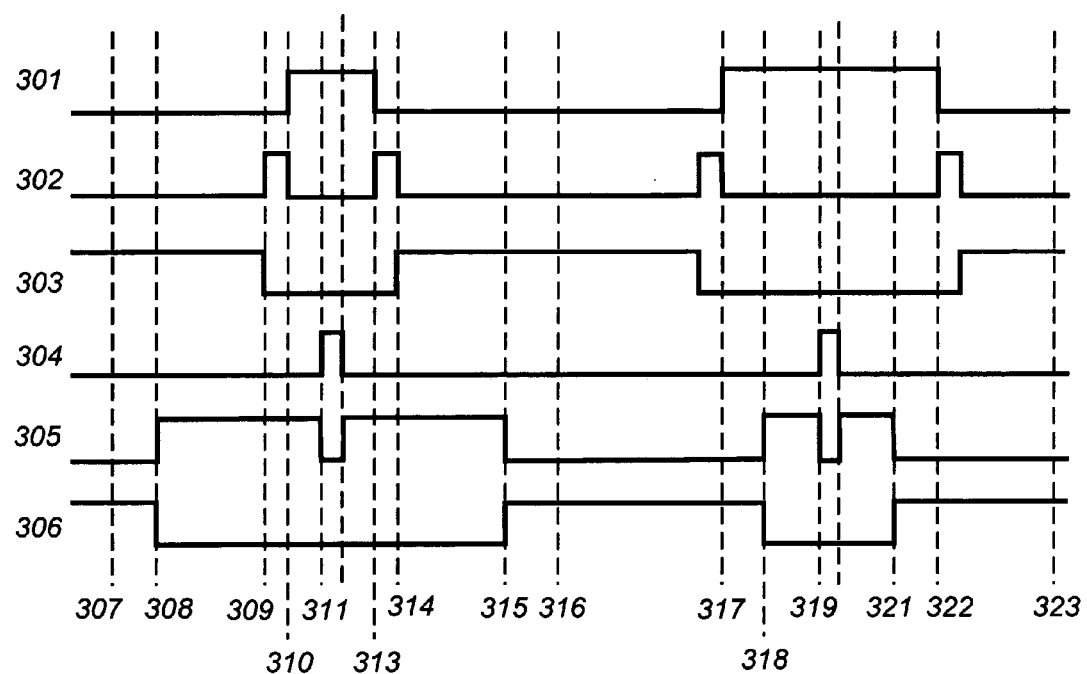
FIG. 3 shows the control waveforms of the amplifier of FIG. 1 when operated per the present invention.

Referring now to FIG. 3, voltage traces 301, 302, 303, 304, 305, and 306 represent control pulses from modulator 101 to switching devices 107, 108, 109, 110, 111, and 112 respectively, all of FIG. 1. The time span between markers 307 and 316 represents one output sample period of the amplifier of FIG. 1; a second sample period is shown between markers 316 and 323.

At marker 310, V+ switching device 107 is seen to be activated in trace 301 until marker 313, the period of which represents the sum of minimum pulsewidth and coarse modulation. Note that this activation between markers 310 and 313 is centered in the sample period indicated by markers 307 and 316. Minimum pulsewidth activations of low-voltage reference switching device 108 bound the V+ switching device 107 activation, from marker 309 to marker 310, and from marker 313 to marker 314; so are as well centered in the sample period indicated by markers 307 and 316. Default ground switching device 109 activity is seen in trace 303 at markers 309 and 314.

At marker 308, low-voltage reference switching device 111 is seen to be activated in trace 305 for a minimum pulsewidth plus one half the fine modulation time, until marker 311. From marker 311 to marker 312, a minimum pulsewidth assertion of V+ switching device 110 is seen in trace 304. At marker 312, low-voltage reference switching device 111 is seen to be again activated in trace 305 for a minimum pulsewidth plus one half the fine modulation time, until marker 315. Note that not only is the V+ minimum pulsewidth between markers 311 and 312 centered in the sample period between markers 307 and 316, but that the two minimum pulsewidths plus fine modulation assertion of switching device 111, seen in trace 305, is as well centered in the sample period. Default ground switching device 112 activity is seen in trace 306 at markers 308 and 315.

In the following sample period between markers 316 and 323, V+ switching device 107 activation seen in trace 301 between markers 317 and 322 is considerably longer than the previous activation between markers 310 and 313, indicating increasing coarse modulation voltage. Note, however, that the distance between the centers of V+ switching device 107 activations in trace 301 from marker 310 to marker 313 and from marker 317 to marker 322 is exactly the same period as the sample period between markers 316 and 323. This indicates no coarse modulation phase error.

Total low-voltage reference switching device 111 activation seen in trace 305 between markers 318 and 321 is considerably shorter than the previous total activation between markers 308 and 315, indicating decreasing fine modulation voltage. Note, however, that the distance between the centers of low-voltage reference switching device 111 activations in trace 305 from marker 308 to marker 315 and from marker 318 to marker 321 is exactly the same period as the sample period between markers 316 and 323. This indicates no fine modulation phase error. Note that all switching device minimum pulsewidths imposed in FIG. 3 are as well centered in their respective sample periods.

From the above figures and discussion, phase-accurate control of all control waveforms of a multi-reference switching amplifier can be seen. Expansion of the technique described herein is expected to include additional references, as well as all other permutations described in 'Multi-Reference High Accuracy Switching Apparatus'. Although center precedence is shown to higher voltages, alternate pulse order adaptations of the present invention are as well anticipated.

I claim:

1. In a multi-reference switching amplifier generating a plurality of output pulses, a modulation technique comprising the steps of:
   providing a plurality of switching devices connected to multiple voltages on both sides of a load; and
   centering the pulses delivered to the switching devices within an output sample period.

2. The method of claim 1, further including the step of:
   ordering the pulses by the relative magnitude of each switched reference.

* * * * *